United States Patent [19]
Hassner et al.

[11] Patent Number: 5,942,005
[45] Date of Patent: Aug. 24, 1999

[54] METHOD AND MEANS FOR COMPUTATIONALLY EFFICIENT ERROR AND ERASURE CORRECTION IN LINEAR CYCLIC CODES

[75] Inventors: Martin Hassner; Ralf Kötter, both of Palo Alto, Calif.; Tetsuya Tamura, Yamato, Japan

[73] Assignee: International Business Machines Corporation, Armonk, N.Y.

[21] Appl. No.: 08/838,375

[22] Filed: Apr. 8, 1997

[51] Int. Cl.[6] .................................................. H03M 13/00

[52] U.S. Cl. ............................................................ 714/784

[58] Field of Search .............................. 371/37.11, 37.07, 371/37.12, 37.08, 30, 37.01

[56] References Cited

U.S. PATENT DOCUMENTS

| | | | |
|---|---|---|---|
| 5,020,060 | 5/1991 | Murai et al. | 371/37.11 |
| 5,583,499 | 12/1996 | Oh et al. | 371/37.11 |
| 5,805,617 | 9/1998 | Im | 371/37.12 |
| 5,818,854 | 10/1998 | Meyer | 371/37.12 |

OTHER PUBLICATIONS

E. R. Berlekamp, "Algebraic Coding Theory", *McGraw–Hill Book Co.*, 1968, pp. 176–199.

Chien, "Cyclic Decoding Procedures for Bose–Chaudhuri–Hocquenghem Codes", *IEEE Transactions on Information Theory*, vol. 10, Oct. 1964, pp. 357–363.

Forney, "On Decoding BCH Codes", *IEEE Transactions on Information Theory*, vol. IT–11, No. 4, Oct. 1965, pp. 549–557.

T. Horiguchi, "High–speed Decoding of BCH Codes Using a New Error–evaluation Algorithm", *Electronics & Communications in Japan Part 3*, vol. 72, No. 12, 1989, pp. 63–71.

R. Kötter, "On Algebraic Decoding of Algebraic–geometric and Cyclic Codes", Linköping University Dissertation, Sweden, 1996, pp. 109–118 No. 419.

*Primary Examiner*—Trinh L. Tu
*Attorney, Agent, or Firm*—James C. Pintner; R. Bruce Brodie

[57] ABSTRACT

A computationally and storage efficient method and means for correcting errors and erasures in linear cyclic coded data, especially Reed-Solomon codes, in which erasure values are ascertained exclusively as a function of syndromes and derived error location polynomials without recourse to computation of intermediate error or erasure values.

10 Claims, 5 Drawing Sheets

FIG. 1

ERROR ERASURE VALUES UNIT

FIG. 2

ERROR ERASURE POLYNOMIAL GENERATOR

FIG. 4

FIG. 5
ERASURE DECODER ALGORITHM

METHOD AND MEANS FOR COMPUTATIONALLY EFFICIENT ERROR AND ERASURE CORRECTION IN LINEAR CYCLIC CODES

FIELD OF THE INVENTION

This invention relates to detection and correction of errors and erasures in binary data strings comprising codewords in a linear cyclic code and, more particularly, to the efficient utilization of computational resources used in the detection and correction such as found in communications and storage subsystems and the like.

DEFINITIONS AND DESCRIPTION OF THE PERTINENT PRIOR ART

In this specification, a sequence of symbols may be formatted as a string of a fixed number of characters or symbols called "words". The term "error" connotes an unknown value change of one or more symbols at an unknown location or position within the word. In contrast, the term "erasure" means that while the value of the change is unknown, the location or position within a word is known.

It is appreciated that error-correcting coding is an arcane subject and most advances in the art are steeped in algebraic theory. The following paragraphs are directed to clarifying and explaining foundational aspects believed pertinent.

Aspects of Linear Cyclic Codes

A code C is said to be a linear cyclic code if the cyclic shift of each codeword is also a codeword. If each codeword u in C is of length n, then the cyclic shift $\pi(u)$ of u is the word of length n obtained from u by shifting the last digit of u and moving it to the beginning, all other digits moving one position to the right.

| U | 10110 111000 0000 1011 |
|---|---|
| $\pi(u)$ | 01011 011100 0000 1101 |

It is possible to build a linear code and achieve an equivalent effect to that of shifting if every codeword c(z) in an (n,k) linear cyclic code over K=(0,1) is generated by dividing a block of binary data m(z) by a generator polynomial g(z) and adding the remainder thereto modulo 2, where c(z) is a polynomial of degree n−1 or less, where $m(z)=m_0+m_{1\times 1}+m_{2\times 2}+ \ldots +m_{(n-r-1)\times(n-r-1)}$, and where $g(Z)=g_0+g_{1\times 1}+g_{2\times 2}+ \ldots +g_{r\times r}$ such that c(z)=m(z)/g(z) plus remainder. As can be seen, the codewords are conventionally represented by a collection of coefficients of a rational polynomial of an arbitrary place variable z in low-to-high order.

Significantly, a received codeword r(z)=c(z)+e(z), where c(z) is the word that was originally recorded or transmitted and e(z) is the error. Relatedly, a syndrome polynomial S(z) is defined informally as S(z)=r(z) mod g(z). Thus, r(z)=c(z) if and only if g(z) divides into r(z) with a remainder of zero, i.e., S(z)=0. Otherwise, it can be shown that the polynomial S(z) is dependent only upon the error function e(z) such that S(z)=e(z) mod g(z).

Reed-Solomon Code as an Illustrative Linear Cyclic Code

Reed-Solomon (RS) codes exemplify linear cyclic codes. RS codes are extensively used because they maintain the maximum distance among codewords for a given length n.

An RS code may be said to comprise a set of vectors over a finite field F having $p^m$ elements, where p is a prime number. The elements of the field F are identified with either of two attributes. That is, they are identified with the $p^m-1$ powers of a distinct element "a" and the symbol "0". Alternatively, they are identified with the set of polynomials of degree of at most m−1 and with the coefficients in the field of integers modulo p. For purposes of convenience, let $p^m=2^8=256$, such that the field F is fixed at $F_{256}$. In this RS code, all operations are performed modulo 2. The field $F_{256}$ can be constructed from the primitive polynomial $p(x)=a^8+a^6+a^5+a+1$.

The defining property of an RS code C is that all vectors $c=(c_0, c_1, \ldots, c_{254}) \in C$ satisfy the relations for a given set of numbers j $$\sum_{k=0}^{k=254} c_k a^{jk} = 0 \bmod p(x).$$

In this example, $j \in \{0,1, \ldots, 7\}$. Also, the positions within a codeword may be indexed by the nonzero elements of the field $a^0, a^1, \ldots, a^{254}$.

Illustratively, assume that errors occurred in predetermined positions in a received codeword are indexed by $\{a^5, a^{13}, a^{28}, a^{29}, a^{124}, a^{136}\}$ and the corresponding error values are $\{a^4, a^5, a^{123}, a^3, a^2, a^0\}$. Thus, if a syndrome from the received codeword r is determined from $$\sum_{k=0}^{k=254} r_k a^{jk} = S_j \bmod p(x)$$

then the nonzero syndromes in the example would be $S_0=a^{86}$, $S_1=a^{235}$, $S_3=a^{45}$, $S_4=a^{205}$, $S_5=a^{239}$, $S_6=a^{113}$, and $S_7=a^{173}$.

Berlekamp and Horiguichi References

In the prior art as expressed in E. R. Berlekamnp, "Algebraic Coding Theory", McGraw-Hill Book Co., 1968, at pages 176–199, Berlekamnp showed that if a linear error correction code had a distance 2t+1 between codewords, then the syndrome S(z) over a codeword c(z) could be expressed formally as the recursion $$S(z) = \sum_{k=0}^{k=(2t-1)} S(z^k) = \frac{w(z)}{\sigma(z)} \bmod(z^{2t})$$

where z is a polynomial presentation of the codeword c(z), w(z) is the error evaluator polynomial, and $\sigma(z)$ is the error locator polynomial. This has been denominated as the "key equation". Relatedly, Berlekamnp showed that the locations of errors within a received codeword r are determined by the index positions j of $a^j$ as the roots of the locator polynomial $\sigma(z)=\sigma(a^k)=0$.

Toshio Horiguchi of NEC Corporation wrote a seminal paper entitled "High-speed Decoding of BCH Codes Using a New Error-evaluation Algorithm", published in *Electronics & Communications In Japan Part* 3, Vol. 72, No. 12, 1989, pp. 63–71. Scripta Technica, Inc., made an English language translation available in 1990.

In this article, Horiguchi pointed out that decoding and error processing a linear cyclic code such as a Reed-Solomon (RS) code requires several broad steps. The first step is that of syndrome determination decoding, while the remaining steps ascertain various factors in the key equation. In the first step, the syndrome set $\{S_j\}$ is derived and the syndrome polynomial S summed over the individual $S_j$'s is determined. Next, the error locator polynomial $\sigma(z)$ and the error evaluator polynomial w(z) are computed. This is followed by ascertaining the error locations $\{l_k\}$ using the method of Chien and the computation of the error values $\{e_k\}$ using the method of Forney. Parenthetically, Chien's method for deriving $\sigma(z)$ was published in an article entitled "Cyclic Decoding Procedures for Bose-Chaudhuri-Hocquenghem Codes", *IEEE Transactions on Information Theory*, Vol. 10, October 1964, pp. 357–363. Likewise, Forney published his mode of estimating w(z) in "On Decoding BCH Codes", *IEEE Transactions on Information Theory*, Vol. IT-11, No. 4, October 1965, pp. 549–557.

Horiguchi further pointed out that when using the Berlekamp method of determining error location and value using the recursive key equation $S(z)=w(z)/\sigma(z)$, w(z) cannot be obtained as a by-product of ascertaining the error locator polynomial $\sigma(z)$. Rather, he proposed a new error evaluating polynomial $\lambda(z)$ that reduced the number of computations and the amount of storage where $$\lambda^j(z) = \sum \lambda_j z^j$$

represents the polynomial $\sigma(z)/(z-z_j)$, and where $z_j$ represents the $j^{th}$ error location.
This led to his formulation for error as $$e_j = \frac{\omega(a^j)}{\sigma_z(a^j)} = \frac{1}{\lambda(a^j) * \sigma_z(a^j)}.$$

That is, only the syndrome and the error locator polynomials are required for detecting and correcting errors. However, if Horiguchi were to extend his method to include correction of erasures, then it would be necessary to utilize the error evaluator polynomial w(z). A related discussion may also be found in the Ph.D. dissertation by Ralf Kötter, "On Algebraic Decoding of Algebraic-geometric and Cyclic Codes", Linköping University, Sweden, 1996, pp. 109–118.
The General Computational Problem Error decoding of linear cyclic codes generally comprises the steps of:

(a) calculating syndromes $\{S\}$ over the received codewords r(z);

(b) formulating the syndrome polynomial S(z); and (c) determining an error locator polynomial $\sigma(z)$ and an error value polynomial w(z)

$$e_j = \frac{\omega(a^j)}{\sigma_z(a^j)}$$

such that $$S(z) = \frac{w(z)}{\sigma(z)} mod(z^{2t}).$$

The location of errors within a received codeword r is determined by the index positions j of $a^j$ as the roots of the locator polynomial $\sigma(z)=\sigma(a^j)=0$. This means that the $j^{th}$ position in the error vector $e_j$ is in error. However, the value of the error must be ascertained from the polynomial w(z). Note that $\sigma_z$ is a derivative with respect to the polynomial placeholder variable z.

The general machine computational problem is to find a rational approximation to the ratio of two polynomials. This is generally done by a partial fraction expansion as applied to Galois field arithmetic as it ordinarily would be applied to functions in a complex plane. Relatedly, the poles of the ratio are the location of the errors, and the residues at these poles are the error values. In the prior art of Berlekamp and Horiguchi et al., error correction of linear cyclic codes, such as an RS code, required the syndrome polynomial S(z) and determining four polynomials $\sigma(z)$, $\lambda(z)$, $\omega(z)$, and $v(z)$. These were assessed in a three-point recursion controlled by $\sigma(z)$ and $\lambda(z)$ for determining error locations. While Horiguchi uses the recursion to ascertain errors $$e_j = \frac{1}{\lambda(z_j) * \sigma_j(z_j)}$$

then he must calculate $\omega(z)$ and use the additional resources in order to extend his method to encompass erasures.

SUMMARY OF THE INVENTION

It is accordingly an object of this invention to devise a machine-implementable method and means for detecting and correcting erasures, in addition to errors within the capacity of a counterpart linear cyclic code.

It is a related object that such method and means exhibit computational and storage efficiency exceeding that of the respective prior art of Berlekamp-Massey and the Horiguchi method and means.

It is yet an additional object that such method and means be useful in any communications or storage subsystem movement of data.

It was unexpectedly observed that erasure values in addition to error values could be determined using only syndromes S and the error locator polynomial $\sigma(z)$, thereby eliminating the error evaluator polynomial w(z). Thus, if $\lambda^j(z)$ represents the polynomial $\sigma(z)/(z-z_j)$ where $$\lambda^j(z) = \sum \lambda_j z^j$$

then the error value $e_j$ can take the form of $$e_j = \frac{\sum \lambda_j S_j}{\lambda(z_j)} = \frac{\sum \sigma_k(a^j) * S_k}{\sigma_z(a^j)}.$$

Correlatively, it was also observed that in the solution of the Berlekamp-Massey version of the recursive key equation, only two polynomials plus a syndrome polynomial need be stored in registers instead of four polynomials plus a syndrome as required in the prior art.

Based upon these observations, the above objects are believed satisfied by a machine-implementable method and means for correcting errors and erasures in binary data strings comprising codewords in a linear cyclic code. The code has a maximum number of consecutive zeroes occurring in the code definition, and each received word is subject to separate processing for location and value of errors.

The method and means include (a) deriving one or more syndromes from each received word and computing an error location polynomial from the derived syndromes, and (b) determining error values from the syndromes and the error location polynomial using only coefficients from the syndromes and the location polynomial without computing an intermediate error evaluator polynomial.

Advantageously, the method and means of this invention extends the single recursion key equation solver from error decoding to erasure decoding. This facilitates two modes of operation: an error-only mode and an erasure-only mode.

The method and means are operable independent of the number of syndromes or the number of erasure pointers.

DESCRIPTION OF THE PREFERRED EMBODIMENTS

This invention is used in a data recovery procedure where binary data strings are mapped into counterpart codewords of a linear cyclic code prior to transmission on a communications subsystem or prior to recording them on disk, tape, or optical devices of a storage subsystem. When the codewords are received or read back from such a communications or storage subsystem, syndromes are derived by dividing the codewords by an appropriate code-generating polynomial and detecting for nonzero syndromes. Correction of any detected errors or erasures is attempted in an on-the-fly mode. Since this process is usually executed at the device attachment level, it is transparent to higher levels, such as at an IBM host S/390 CPU or IBM 3990 storage control unit. It is only where correction cannot be performed that the next higher level of a subsystem becomes involved. At this point, a decision must be made either to retry the transmission or reread the data words and reprocess them, ignore any errors, or report device failure. Where data on a storage device or the like is unavailable, then information must be reconstructed by some form of context processing, such as may be found in RAID 5-level DASD subsystems using redundant information stored on other devices.

Figure 1:
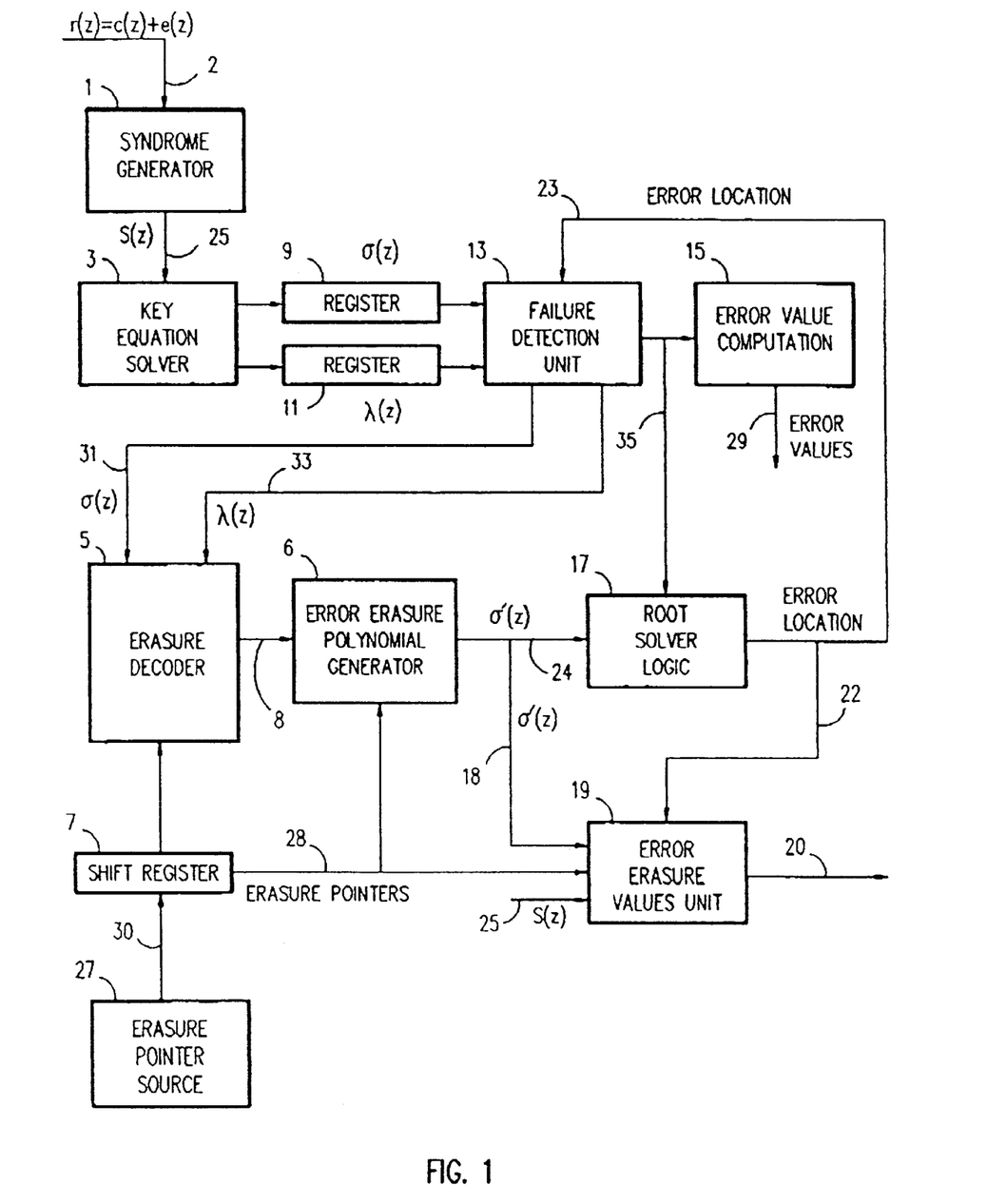
FIG. 1 depicts a functional block diagram including that of an erasure-correcting, register-limited, linear cyclic decoder according to the invention.

Referring now to FIG. 1, there is shown a functional block diagram including that of an erasure-correcting, register-limited, linear cyclic decoder according to the invention. It is preferably located in the readback path of a writable storage device (not shown). In this embodiment, each received code word r(x) on an input path 2 is applied to a syndrome generator 1. The syndromes are in turn applied to a key equation solver 3 (KES 3) of the Berlekamp-Massey type. The KES 3 derives two strings of coefficients from the syndromes S, namely, the coefficients defining the error locator polynomial $\sigma(z)$ and a normalized value $\lambda^j(z)$. These are respectively placed in registers 9 and 11. Note that $\lambda^j(z) = \sigma(z)/(z-z_j)$, where $z_j$ is the $j^{th}$ error location.

The first step is to ascertain the location of one or more errors. This means that it is desired to find the roots of the error location polynomial equation $\sigma(z)=\sigma(a^j)=0$. In this regard, $\sigma(a^j)$ is applied to root solver logic 17 through failure detector 13 over path 35. If the solver logic 17 converges on a root, then the detection unit 13 passes the information to error value computation unit 15 for further processing. However, if the solver logic 17 cannot converge, then the error detection unit 13 applies the quantity $\sigma(z)$ and a normalized value $\lambda^j(z)$ to an erasure decoder 5 for further processing over paths 31 and 33.

At this point, it should be appreciated that the failure to find roots for the error locator polynomial $\sigma(z)$ merely means that the nonzero syndromes may be due to erasures. It is necessary to derive an adjusted error locator polynomial $\sigma'(z)$ as a function of $\sigma(z)$, $\lambda^j(z)$, erasure pointers, where $z=a^j$ according to an extended Berlekamp-Massey algorithm where the erasure pointers operate to modify the locations of the possible roots.

Referring again to FIG. 1, if a failure detection unit 13 determines that a root for the error locator polynomial equation $\sigma(z)=\sigma(a^j)=0$ has not been found, then an extended Berlekamp-Massey process is invoked for calculating a modified locator polynomial $\sigma'(z)$ considering erasures. This is done by applying the variables $\sigma(z)$ and $\lambda^j(z)$ and an erasure pointer EP to erasure polynomial generator 6 and extracting a modified value $\sigma'(z)$. This means that generator 6 repeats Berlekamp's algorithm using the values $\sigma(z)$ and $\lambda^j(z)$ and the erasure pointer derived from a source 27 is supplied to the generator 6 over a path 28 through shift register 7. The modified locator $\sigma'(z)$ is in turn applied to root solver logic 17 over path 24 and also presented at erasure values unit 19.

Figure 4:
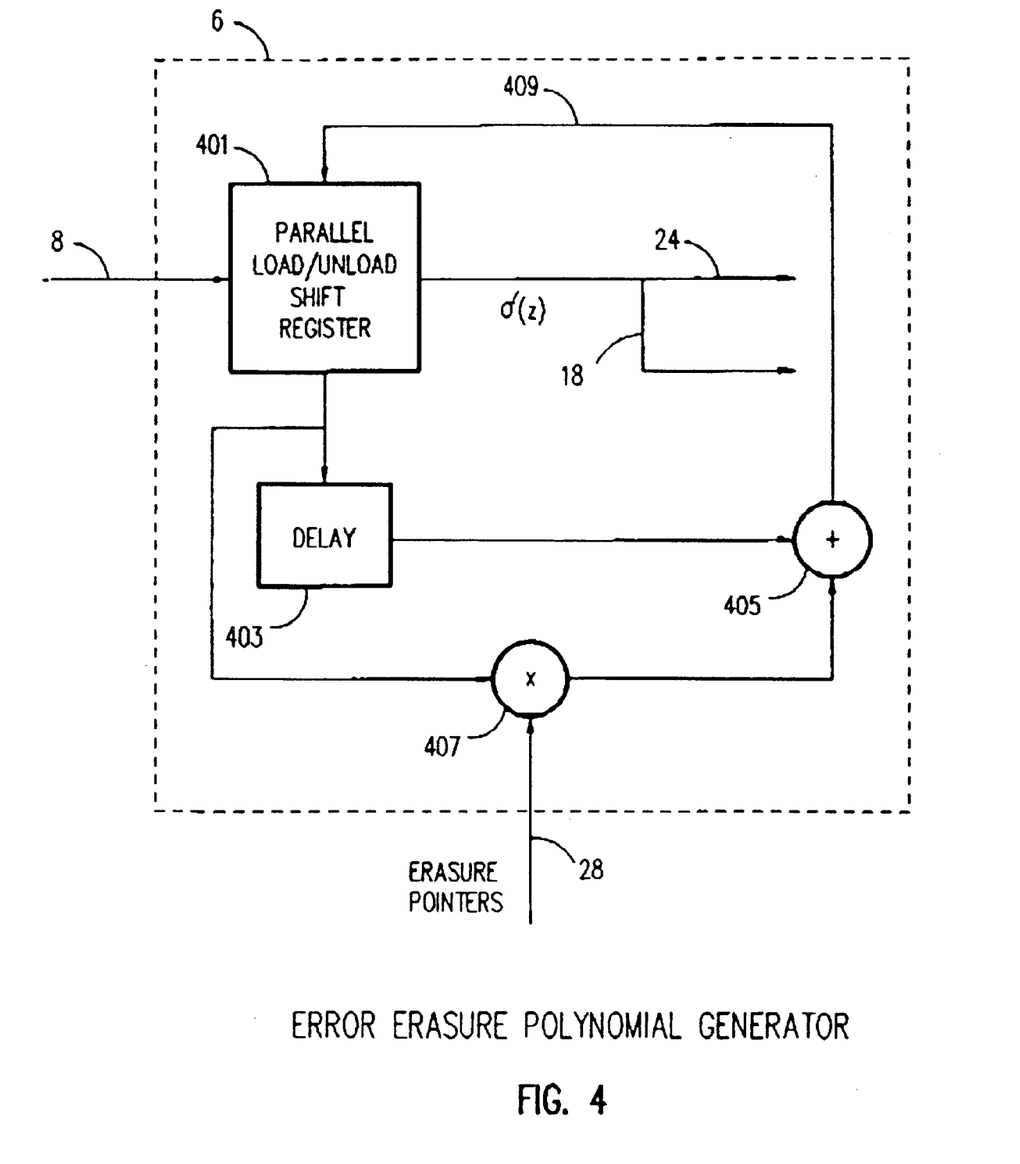
FIG. 4 sets out an erasure locator polynomial generator 6 used in the embodiment shown in FIG. 1.

Referring now to FIG. 4, there is shown the erasure location polynomial generator 6. The $\sigma(z)$, $\lambda^j(z)$ outputs of decoder 5 are loaded in parallel to shift register 401. The formation of the error location polynomial $\sigma'(z)$ involves a reentrant loop in which values from register 401 are time shifted through delay 403 and additively combined at gate 405 with a product formed from EP path 28 and the current shifted value from register 401. The modified value is then shifted into the next position at the top of the register. This processing repeats for each value in the output parallel loaded from decoder 5. After each value is processed, the modified contents of register 401 are shifted out in parallel and applied to paths 24 and 18. This now constitutes $\sigma'(z)$. Concurrently, the new parallel output from decoder 5 is loaded into register 401 on path 8.

It should be further appreciated that finding a root of the error location polynomial $\sigma'(z)=0$ using a root solver logic 17 is an iterative process. Each iteration involves applying $\sigma'(z)$ to a root solver logic 17. The output of the root solver logic is applied to the failure detector unit 13 over path 23. If this is not a root, then erasure decoder 5 processes another pointer from register 7 and supplies outputs to generator 6 to form yet a further modified version of $\sigma'(z)$. Such a failure can repeat only up to a predetermined number of times, after which it is concluded that the error or erasure is not recoverable. However, where a root is found by solver logic 17, then signal indication of the error locations $\{l_j\}$ is provided to erasure values unit 19 and failure detection unit 13 over paths 22 and 23, respectively. Once the error locations $\{l_j\}$ have been determined, then it is now possible to determine the erasure values $e_j$ according to the invention in the erasure values unit 19.

Figure 2:
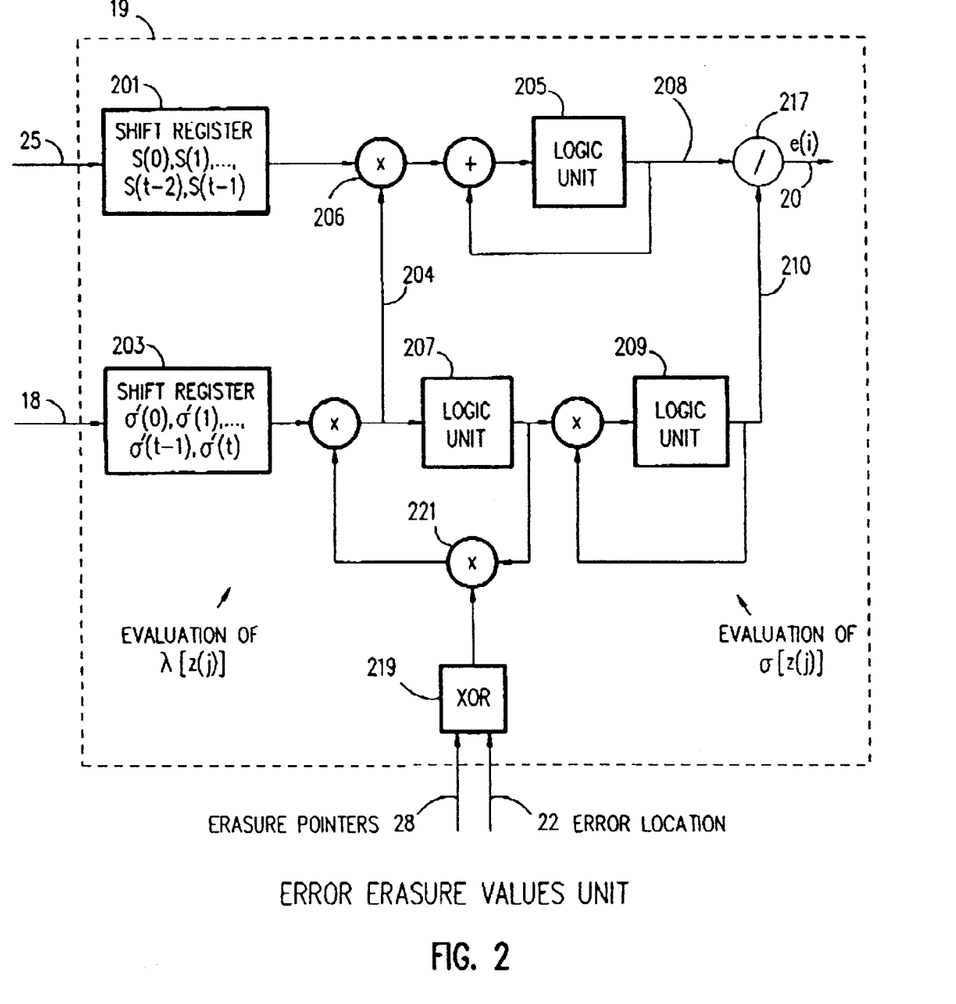
FIG. 2 shows logical details of the erasure values unit 19 as set out in FIG. 1 also according to the invention.

Referring now to FIG. 2, there is shown the logical detail of the erasure values unit 19 as set out in FIG. 1. The erasure values unit 19 is responsive to (a) syndromes $S(0), S(1), \ldots, S(t-1)$ from syndrome generator 1 as applied over path 25 to shift register 201, (b) to the error location values $\{l_j\}$ from solver logic 17 on path 22, (c) to the modified error locator polynomial $\sigma'(a^j)$ from generator 6 as applied over path 18 to shift register 203, and (d) to the EP from shift register 7 as applied on path 28. Note that EPs and error location $\{l_j\}$ values are applied to the $\lambda(z_j)$ evaluation logic 207 through XOR 219 and multiplier 221. Lastly, the output $e_j$ from erasure values unit 19 appears on path 20 from divider 217 as the approximated ratio of two polynomials evaluated at specific locations $l_j$.

During any given cycle for shift register 203 and for a given EP on path 28 or $l_j$ on path 22, a value of $\sigma'(a^j)$ is moved into logic unit 207. There, it is normalized to form the value $\lambda(z_j)=\sigma(z)/(z-z_j)$. This $\lambda(z_j)$ value is also supplied over path 204 to multiplier 206. Here, it is used to form one term of the inner product $\lambda(z_j)*S(j)$. In this regard, logic arrangement 205 accumulates these inner products over the codeword space k to form the numerator of the error value $e_j$. It should be noted that logic unit 209 forms the derivative of the error location polynomial $\sigma(z)$ over z. Relatedly, the error $e_j$ is calculated as the ratio output from logic arrangement 205 on path 208, and the output from unit 209 over path 210.

Figure 3:
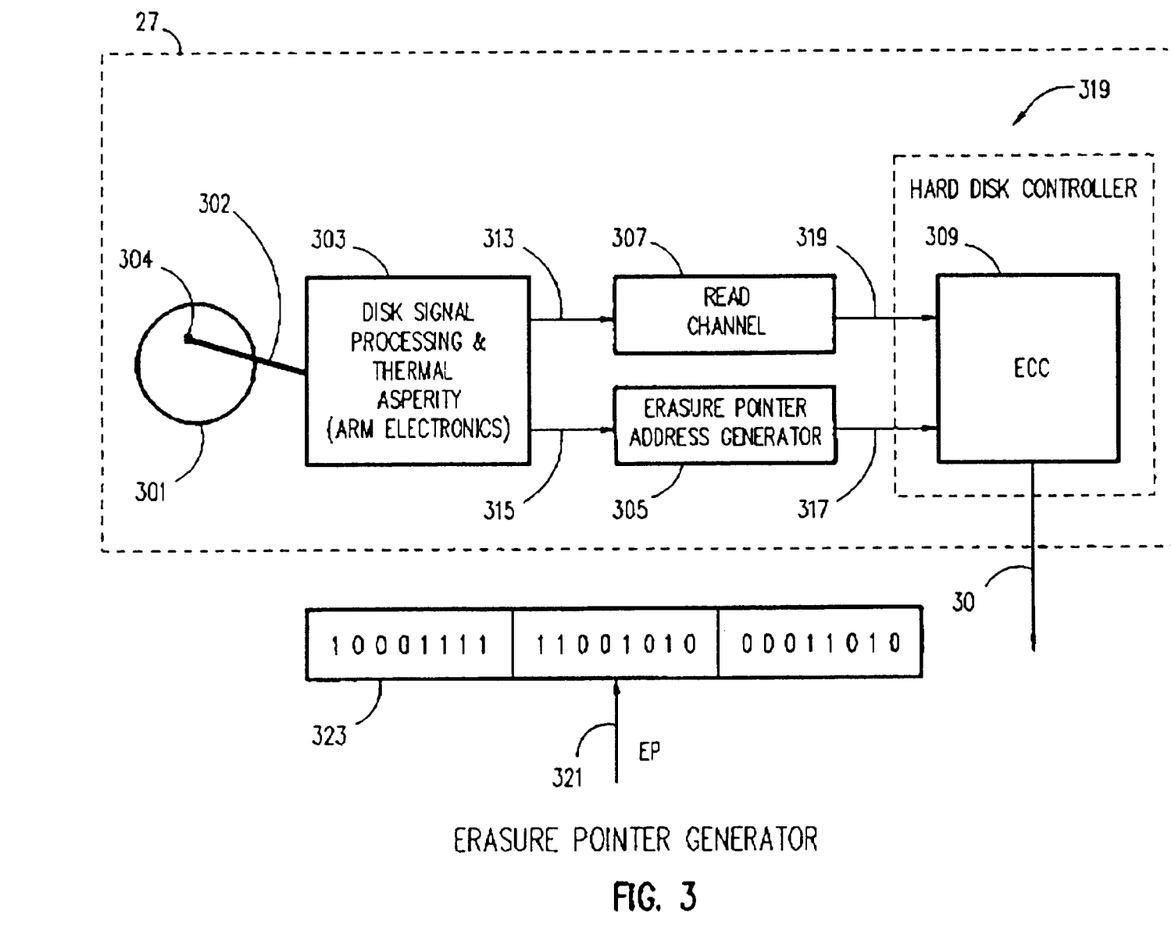
FIG. 3 illustrates the logic of an erasure pointer generator 27 used in the embodiments of FIGS. 1 and 2.

Referring now to FIG. 3, there is shown the logic of an erasure pointer generator 27 used in the embodiments of FIGS. 1 and 2 of this invention. In this circumstance, a cyclic, multitracked, recording disk storage medium 301 is accessed by an arm 302. This arm is preferably tipped with a magnetoresistive read/write head 304. Data and events are sensed by unit 303 and passed over separate paths to a disk drive controller 311. Thus, time-varying signals are resolved as binary bit signals and passed from unit 303 over a read channel 307 to the controller 311. Detected anomalous events such as track/head misalignments, read/write head state changes, thermal asperities, etc. are reported to an address generator 305 separately over path 315.

One source of erasure has been associated with the occurrence of thermal asperities in magnetoresistive (MR) heads. In this situation, an asperity on disk 301 would mechanically impact MR head 304. The heat resulting from the impact would change the magnetoresistive head characteristics, such as by DC masking the sensed flux changes, resulting in runs of erased bit values possibly exceeding the resolving power of the linear cyclic error correction code.

Referring again to FIG. 3, generator 305 provides an address or pointer 321 associated with the location 323 of the event on the disk to the controller over path 317. Such anomalous events are statistically associated with erasures. Consequently, their pointers are used to modify the values involved in locating the roots of the modified error locator polynomial $\sigma'(z)$ when it is subjected to an extended Berlekamp-Massey process as discussed in connection with FIGS. 1 and 2.

Figure 5:
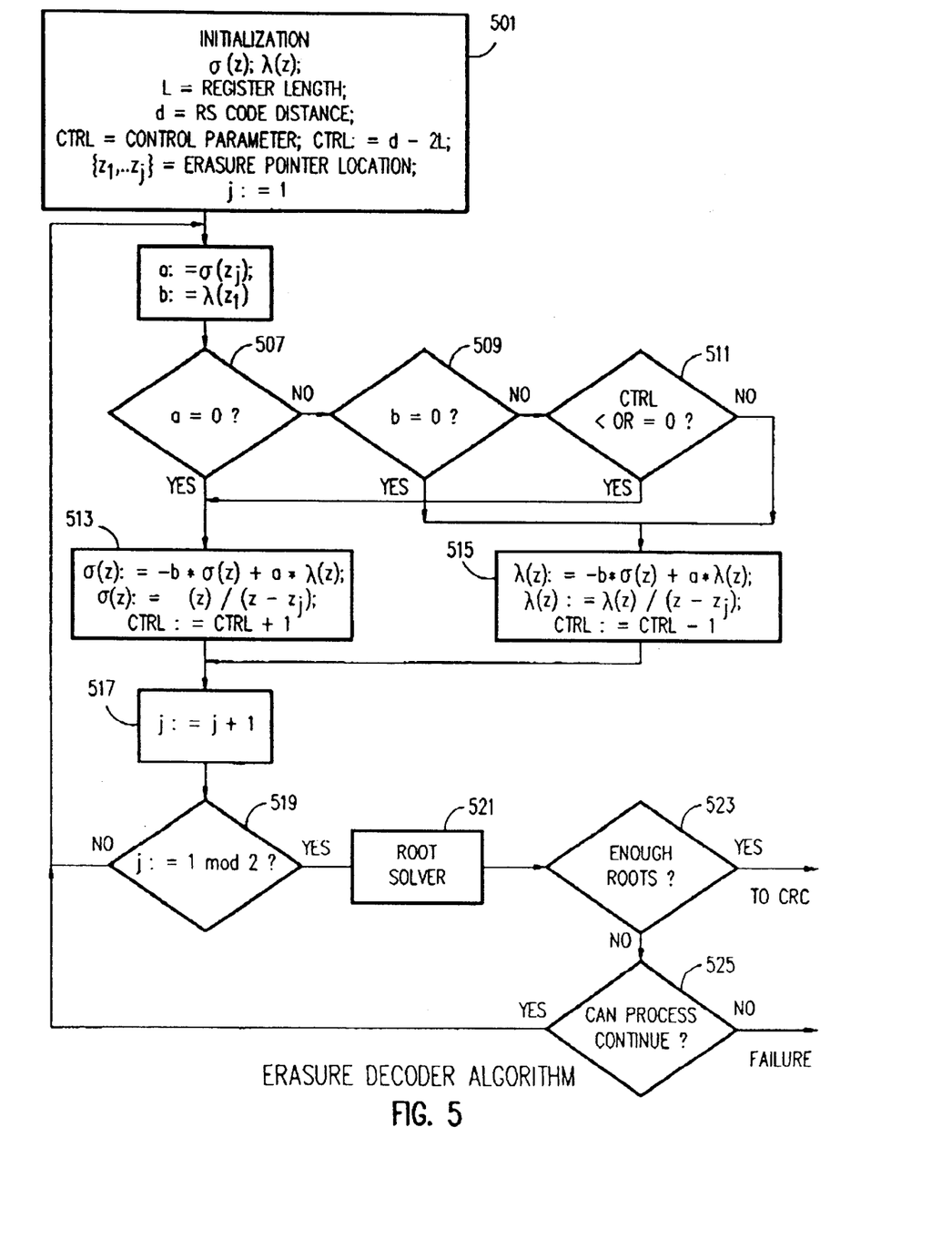
FIG. 5 depicts the computational flow of control used by the erasure decoder algorithm according to the invention.

Referring now to FIG. 5, there is shown a machine-implementable iterative method for forming a modified error locator polynomial $\sigma'(z_0)$ and finding the roots of $\sigma'(z_j)=\sigma'(a^j)=0$ using $\sigma(z_j)$ and the normalized locator polynomial $\lambda(z_0)$ values. The method controls the number of iterations and tests whether sufficient roots have been found or the process has failed.

The method in FIG. 5 is initialized at step 501 with predetermined values for $\sigma(z_0)$, $\lambda(z_0)$, register length L, RS code distance d, an incrementable/decrementable control parameter "ctlr", erasure pointer location, and an index j. It should be noted that ctlr is set equal to d-2L. Also, for notational convenience, the variables $\sigma(z_j)$, $\lambda(z_j)$ are respectively assigned to two arbitrary variables designed "a" and "b" in step 507.

Next, $\sigma(z)$, $\lambda(z)$, and car are tested for nullity at steps 507, 509, and 511. If the values for the variables a, b, and ctlr are null, then ctlr is decremented and $\sigma(z_j)$ is recursively changed in step 515. Otherwise, ctlr is incremented and $\sigma(z_j)$ is recursively changed in step 513. At this point, the index j is incremented in step 517 and tested in step 519. The test of the index value j as to whether it satisfies 1 mod 2 operates to assure that every other index j increment will result in an iteration back to step 503, while the intervening increment results in the activation of the root solver 17 in step 521.

Steps 523 and 525 ascertain whether the root solver has converged on one or more roots satisfying the relation $\sigma(z_j)=\sigma(a^j)=0$. If there are enough roots $\{l_j\}$ per step 523, then cyclic redundancy code (CRC) processing continues. If not, then the additional test in step 525 is made. Here, the focus is on whether another iteration starting at step 503 can be made. One reason that another iteration cannot be made is where the number of iterations has already exceeded a predetermined number.

While the invention has been described with respect to an illustrative embodiment thereof, it will be understood that various changes may be made in the method and means herein described without departing from the scope and teaching of the invention. Accordingly, the described embodiment is to be considered merely exemplary and the invention is not to be limited except as specified in the attached claims.

What is claimed is:

1. A machine-implementable method for correcting errors and erasures in binary data strings, said data strings comprising codewords in a linear cyclic code, said codewords being either received from a communications subsystem or read back from a storage subsystem, the codewords in said code having up to a predetermined maximum number of consecutive zero or null values, each received codeword being subject to separate processing for location and value of errors, comprising the steps of:

(a) deriving one or more syndromes $S_j$ from each received codeword and computing an error location polynomial $\sigma(z)$ from the derived syndromes, said syndromes and error location polynomials being represented by counterpart binary valued coefficients; and (b) determining error and erasure values from the syndromes and the error location polynomial using only the coefficients from the syndromes and the location polynomial without computing an intermediate error evaluator polynomial.

2. The method according to claim 1, wherein the linear cyclic code is of the Reed-Solomon type.

3. The method according to claim 1, wherein the step of determining error and erasure values includes the further steps of:

(a) resolving any roots of the error location polynomial $\sigma(z)=\sigma(a^j)=0$;

(b) in the event that roots in step (a) cannot be resolved, deriving another error locator polynomial $\sigma'(z)$ as a function of $\sigma(z)$, a normalized location polynomial $\lambda(z)=\sigma(z)/(z-z_j)$, and an extrinsically supplied erasure pointer (EP) and resolving any roots of the polynomial $\sigma'(z)=\sigma'(a^j)=0$; and (c) in the event that roots in step (b) can be resolved, computing an error erasure value $e_j$ solely as a function of $\lambda(z)$, $\sigma'(z)$, and $S_j$ such that $$e_j = \frac{\sum \lambda_j S_j}{\lambda(z_j)} = \frac{\sum \sigma_k(a^j)*S_k}{\sigma_{z'}(a^j)}.$$

4. A machine-implementable method for correcting errors and erasures in binary data strings, said data strings comprising codewords in a linear cyclic code, each codeword r(z) being either received from a communications subsystem or read back from a storage subsystem, the codewords in said code having up to a predetermined maximum number of consecutive zero or null values, where $r(z)=a_0+a_1z+a_2z^2+\ldots+a_{n-1}z^{n-1}$, indices j,k lying in the integer range $0 \leq j, k \leq n-1$, each received word $r(z)$ being subject to separate processing for error location $\sigma(z)$ and error values, comprising the steps of:

(a) deriving one or more syndromes $S_k$ from each received codeword and computing an error location polynomial $\sigma_k(z^j)$ from the derived syndromes, said syndromes and error location polynomials being represented by counterpart binary valued coefficients; and (b) determining error values $e_j$ from the syndromes and the error location polynomial using only the coefficients $a^j$ from the syndromes, the error location polynomial $\sigma_k(a^j)$ and its derivative of said location polynomial $\sigma_{z'}(a^j)$ such that $$e_j = \frac{\sum \lambda_j S_j}{\lambda(z_j)} = \frac{\sum \sigma_k(a^j) * S_k}{\sigma_{z'}(a^j)}$$

said determination occurring without computing an intermediate error evaluator polynomial.

5. An apparatus for correcting errors and erasures in binary data strings, said data strings comprising codewords in a linear cyclic code, said codewords either being received from a communications subsystem or read back from a storage subsystem, the codewords in said code having up to a predetermined maximum number of consecutive zero or null values, comprising:

(a) means for deriving one or more syndromes from each received word and for computing an error location polynomial from the derived syndromes, said syndromes and error location polynomials being represented by counterpart binary valued coefficients; and (b) means for determining error and erasure values responsive to the derived syndromes and the computed error location polynomial, said determining means using only the coefficients from the syndromes and the location polynomial without computing an intermediate error evaluator polynomial.

6. The apparatus according to claim 5, wherein said means for determining error values utilizes only a single recursive processing arrangement for ascertaining error and erasure values.

7. In a system having a source of binary data strings, means for mapping each data string into one or more codewords selected from a predetermined linear cyclic code, means for recording said codewords on a suitable cyclic, multitracked, storage medium, and means responsive to readback from the storage medium for detecting and correcting codewords corrupted by errors or erasures, said code having up to a maximum number of consecutive zero or null values occurring in said code definition, wherein the improvement in said means for detecting and correcting corrupted codewords comprises:

(a) means responsive to the codewords for deriving a set of syndromes $\{S_j\}$;

(b) a Berlekamp-Massey type key equation solver for deriving coefficients of an error locator polynomial $\sigma(z)$ and a normalized value $\lambda(z^j) = \sigma(z)/(z-z_j)$ thereof;

(c) means for resolving any roots of the error location polynomial $\sigma(z) = \sigma(a^j) = 0$ and for computing an error value at the location represented by said root;

(d) means responsive to the event that roots associated with $\sigma(z) = \sigma(a^j) = 0$ cannot be resolved for deriving another error locator polynomial $\sigma'(z)$ as a function of $\sigma(z)$, a normalized location polynomial $\lambda(z) = \sigma(z)/(z-z_j)$, and an extrinsically supplied erasure pointer (EP) and for resolving any roots of the polynomial $\sigma'(z) = \sigma'(a^j) = 0$; and (e) means responsive to the event that roots associated with $\sigma'(z) = \sigma'(a^j) = 0$ can be resolved for determining an error erasure value $e_j$ solely as a function of $\lambda(z)$, $\sigma'(z)$, and $S_j$ such that $$e_j = \frac{\sum \lambda_j S_j}{\lambda(z_j)} = \frac{\sum \sigma_k(a^j) * S_k}{\sigma_{z'}(a^j)}$$

without computing an intermediate error evaluator polynomial.

8. The system according to claim 7, wherein the means for resolving roots either of $\sigma(z) = \sigma(a^j) = 0$ or $\sigma'(z) = \sigma'(a^j) = 0$ resolves the roots recursively in a predetermined maximum number of iterations.

9. The system according to claim 7, wherein the means for deriving another error locator polynomial $\sigma'(z)$ includes a shift register responsive to a prior value of the $\sigma(z)$ polynomial parallel loaded into the shift register; means closed loop coupling the register for reiteratively modifying a prior value $\sigma(z)$ with an extrinsically supplied error pointer EP to form a second polynomial $\sigma'(z)$ resident in said register; and means for unloading said second polynomial $\sigma'(z)$ and applying it to said root resolving means.

10. A machine-implementable method for correcting errors and erasures in binary data strings, said data strings comprising codewords in a linear cyclic code, said codewords being either received from a communications subsystem or read back from a storage subsystem, the codewords in said code having up to a predetermined maximum number of consecutive zero or null values, each received codeword being subject to separate processing for location and value of errors, comprising the steps of:

(a) deriving one or more syndromes $S_j$ from each received word and computing an error location polynomial $\sigma(z)$ from the derived syndromes, said syndromes and error location polynomials being represented by counterpart binary valued coefficients; and (b) determining root locations for the relation $\sigma(z_j) = \sigma(a^j) = 0$;

(c) in the event that root locations in step (b) are not resolved, modifying the location polynomial $\sigma(z)$ to form a modified location polynomial $\sigma'(z)$ using extrinsically obtained erasure pointers and resolving the roots of the modified location polynomial relation $\sigma'(z_j) = \sigma'(a^j) = 0$ within a predetermined number of iterations; and (d) determining error and erasure values from the syndromes and the modified error location polynomial using only coefficients from the syndromes and the location polynomials without computing an intermediate error evaluator polynomial.

* * * * *